(12) United States Patent
Kuga (10) Patent No.: US 9,899,189 B2
(45) Date of Patent: Feb. 20, 2018

(54) ION IMPLANTER

(71) Applicant: Mitsubishi Electric Corporation, Tokyo (JP)

(72) Inventor: Shoichi Kuga, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/206,331

(22) Filed: Jul. 11, 2016

(65) Prior Publication Data
US 2017/0178860 A1    Jun. 22, 2017

(30) Foreign Application Priority Data
Dec. 22, 2015    (JP) .................................. 2015-249490

(51) Int. Cl.
*H01J 37/08* (2006.01)
*H01J 37/317* (2006.01)
*H01J 37/30* (2006.01)

(52) U.S. Cl.
CPC .......... *H01J 37/3171* (2013.01); *H01J 37/08* (2013.01); *H01J 37/3002* (2013.01); *H01J 2237/31701* (2013.01)

(58) Field of Classification Search
None
See application file for complete search history.

(56) References Cited

U.S. PATENT DOCUMENTS

| 5,126,576 A * | 6/1992 | Wauk, II | ............... H01J 37/026 |
| | | | 250/492.2 |
| 5,969,398 A * | 10/1999 | Murakami | .......... H01L 21/2236 |
| | | | 257/412 |
| 6,287,986 B1 * | 9/2001 | Mihara | .................. C23C 14/088 |
| | | | 257/E21.272 |

(Continued)

FOREIGN PATENT DOCUMENTS

| JP | 62-126538 A | 6/1987 |
| JP | 62126538 A * | 6/1987 |

(Continued)

OTHER PUBLICATIONS

An Office Action issued by the German Patent Office dated Dec. 28, 2016, which corresponds to German Patent Application No. 10 2016 224 319.5 and is related to U.S. Appl. No. 15/206,331 with partial English translation.

(Continued)

*Primary Examiner* — Andrew Smyth
(74) *Attorney, Agent, or Firm* — Studebaker & Brackett PC (57) ABSTRACT

A technique disclosed in the present specification relates to an ion implanter capable of preventing a semiconductor substrate from being damaged by an abnormal electric discharge through a simple method. The ion implanter of this technique includes an ion irradiation unit configured to irradiate a surface of a semiconductor substrate with ions. The ion implanter also includes at least one electrode (needle electrode, annular electrode) disposed in a position (Continued)

in the vicinity of at least one of back and side surfaces of an end of the semiconductor substrate. The position is dischargeable to and from the semiconductor substrate. The at least one electrode (needle electrode, annular electrode) is spaced apart from the semiconductor substrate.

5 Claims, 7 Drawing Sheets

(56) References Cited

U.S. PATENT DOCUMENTS

| | | | |
|---|---|---|---|
| 6,528,804 B1* | 3/2003 | Sullivan | H01J 37/3171 |
| | | | 250/398 |
| 2002/0167779 A1* | 11/2002 | Carroll | G02B 6/32 |
| | | | 361/179 |
| 2006/0151786 A1* | 7/2006 | Nakanishi | H01J 27/08 |
| | | | 257/61 |
| 2008/0160212 A1* | 7/2008 | Koo | H01J 37/32623 |
| | | | 427/569 |

FOREIGN PATENT DOCUMENTS

| | | | | |
|---|---|---|---|---|
| JP | 62126538 U | * | 8/1987 | |
| WO | WO 2012073142 A2 | * | 6/2012 | C23C 14/48 |
| WO | WO 2012073142 A3 | * | 11/2012 | C23C 14/48 |

OTHER PUBLICATIONS

An Office Action issued by the German Patent Office dated May 24, 2017, which corresponds to German Patent Application No. 10 2016 224 319.5 and is related to U.S. Appl. No. 15/206,331; with partial English language translation, Citing Reference: US 20060151786 A1.

* cited by examiner

FIG. 7

ION IMPLANTER

BACKGROUND OF THE INVENTION

Field of the Invention

A technique disclosed in the specification relates to ion implanters, and relates to, for instance, ion implanters that implant ions into semiconductor substrates.

Description of the Background Art

An ion implanter includes an ion source system, a mass spectrometer system, a beam line system, and an end station.

The ion source system ionizes a to-be-implanted element and further applies a high voltage to the ionized element to be thus extracted as ion beams. The mass spectrometer system applies a magnetic field to the ion beams, which are extracted in the ion source system using an electromagnet, thus deflecting travelling directions of the ion beams. The beam line system transports the ion beams.

The end station sets a semiconductor substrate that is a target substrate, and performs an ion implantation process. The end station is provided with an electron shower generator that supplies secondary electrons.

Desired ions of the element that have passed through the beam line system are radiated to the semiconductor substrate, which is set in the end station. Being irradiated with the ions of the element that have electric charges, the semiconductor substrate has accumulated electric charges. The semiconductor substrate is thus electrified.

To address this, the secondary electrons from the electron shower generator, which is disposed in the end station, are supplied to the ion beams. Hence, the semiconductor substrate is simultaneously irradiated with both the secondary electrons and the ion beams. Doing so neutralizes the accumulated electric charges within the semiconductor substrate. This prevents the semiconductor substrate from being electrified (for instance, see Japanese Patent Application Laid-Open No. 62-126538).

The passage of time deteriorates a filament that is a generation source of the secondary electrons in an electron shower generator of a conventional ion implanter, where the electron shower generator is used for preventing a semiconductor substrate from being electrified. Consequently, this deterioration changes the amount of secondary electrons supplied from the filament. It has been thus difficult to regulate the secondary electrons to be supplied.

It has been difficult to regulate the secondary electrons to be supplied from the electron shower generator in accordance with implantation energies of the ion beams or with the capacitance of electric charges in the semiconductor substrate as set. In particular, a relatively-large beam current ranging from several tens of milliamperes to several hundreds of milliamperes can polarize the ion beams due to the electric charges of themselves, thus resulting in a non-uniform amount of ions to be implanted. Consequently, it has been difficult to regulate the secondary electrons to be supplied from the electron shower generator.

The relatively-large beam current ranging from several tens of milliamperes to several hundreds of milliamperes may cause the electric charges of the electrified semiconductor substrate to be saturated. In such a case, the semiconductor substrate might have had an abnormal electric discharge in a front surface of the semiconductor substrate, thus damaging a semiconductor element or the semiconductor substrate itself.

On the other hand, a small beam current to prevent the semiconductor substrate from being electrified takes a long time for irradiation due to a decrease in implantation energy. Because of this long time irradiation, the ion implanter has a lower processing capability. Further, if the semiconductor substrate is extremely thin in a relatively-small beam current ranging from several milliamperes to several tens of milliamperes, the abnormal electric discharge might also have damaged the semiconductor element or the semiconductor substrate itself like in the relatively-large beam current.

SUMMARY OF THE INVENTION

A technique disclosed in the present specification relates to an ion implanter capable of preventing a semiconductor substrate from being damaged by an abnormal electric discharge through a simple method.

The ion implanter according to one aspect of the technique disclosed in the present specification includes an ion irradiation unit configured to irradiate a front surface of a semiconductor substrate with an ion. The ion implanter also includes at least one electrode disposed in a position in the vicinity of at least one of back and side surfaces of an end of the semiconductor substrate. The position is electrically dischargeable to and from the semiconductor substrate. The at least one electrode is spaced apart from the semiconductor substrate.

According to such a configuration, the at least one electrode causes an electric discharge to occur in the vicinity of the end of the semiconductor substrate. This prevents the semiconductor substrate from being damaged by the abnormal electric discharge through the simple method. Moreover, the semiconductor substrate and the at least one electrode are not in contact with each other. This prevents the semiconductor substrate from being contaminated or damaged by the at least one electrode.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments will be described with reference to the accompanying drawings. It is noted that the drawings are merely schematic representations of the invention, and the interrelationships between sizes and positions of individual images shown in the separate drawings are not necessarily provided with accuracy, and can be thus changed as appropriate. It is further noted that throughout the following descriptions, like components are denoted by the same symbols and also have like names and functions. Detailed descriptions of the like components may be thus omitted.

Still further, throughout the following descriptions, the use of terms, such as "top", "under", "side", "bottom", "front", and "back", that indicate specific positions and specific directions is merely for convenience in easy appreciation of the embodiments. These terms thus have nothing to do with actual directions when the embodiments are actually implemented.

First Preferred Embodiment

The following describes an ion implanter according to a first preferred embodiment. For convenience of description, initially provided is a description about the general structure of a typical ion implanter.

Figure 6:
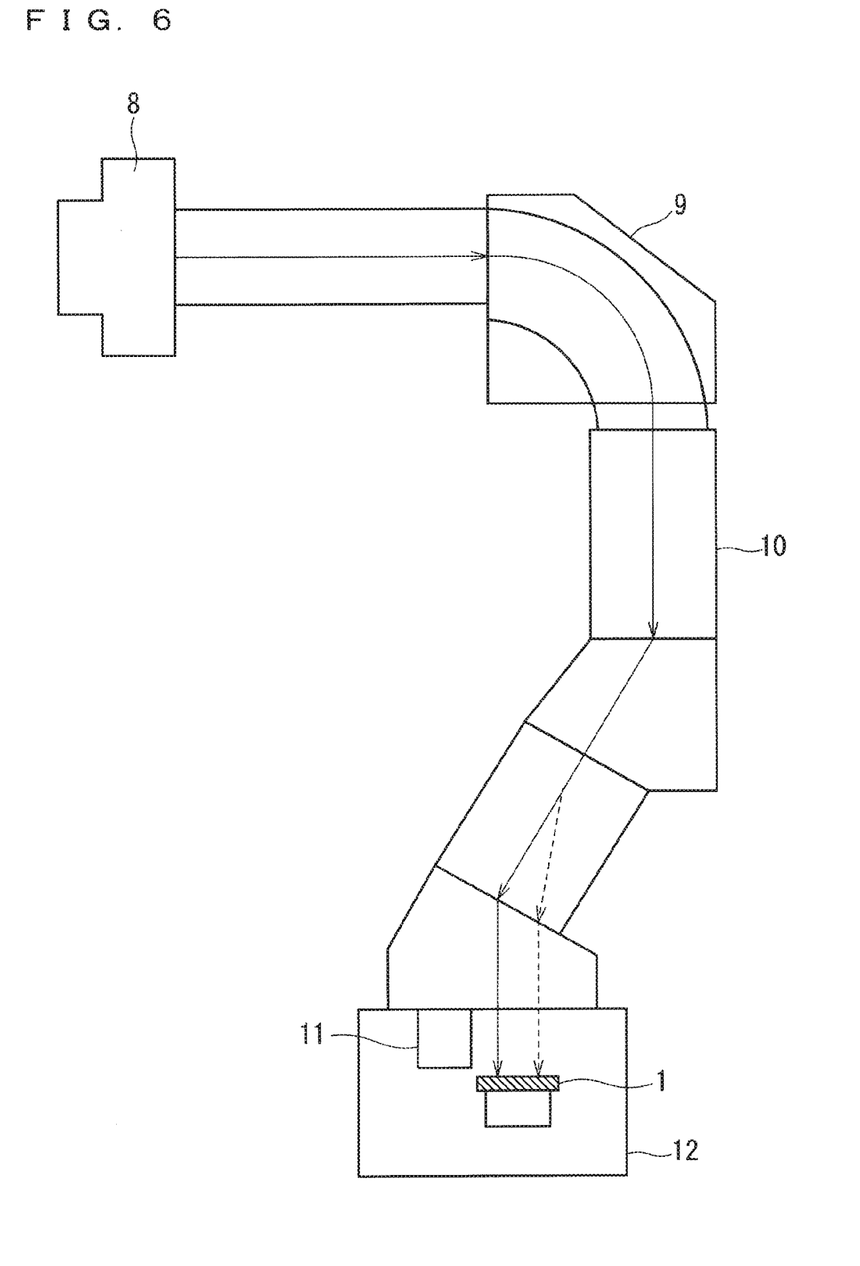
FIG. 6 is a plan view illustrating the structure of the ion implanter in its entirety according to the preferred embodiment.

FIG. 6 is a plan view illustrating the general structure of the ion implanter. Ion implanters are generally high-voltage and high-vacuum equipment. As illustrated in FIG. 6, the ion implanter includes an ion source system 8, a mass spectrometer system 9, a beam line system 10, and an end station 12.

The ion source system 8 ionizes a to-be-implanted element and further applies a high voltage to the ionized element to be thus extracted as ion beams. The mass spectrometer system 9 applies, using an electromagnet, a magnetic field to the ion beams, which is extracted in the ion source system 8, thus deflecting travelling directions of the ion beams. Applying the magnetic field enables only elements having predetermined masses to be sorted. That is, a light element in mass is deflected too much, and a heavy element in mass is not completely deflected. Accordingly, adjusting the magnetic field enables an element having a required mass to be extracted.

Further, the beam line system 10 transports the ion beams. In the beam line system 10, applying a predetermined voltage accelerates, shapes, gathers and scans the ion beams.

Further, the end station 12 sets a semiconductor substrate 1 that is a target substrate, and then performs an ion implantation process. The end station 12 is provided with an electron shower generator 11 that supplies secondary electrons.

Desired ions of the element that have passed through the beam line system 10 are radiated to the semiconductor substrate 1, which is set in the end station 12. Being irradiated with the ions of the elements that have electric charges, the semiconductor substrate 1 has accumulated electric charges. The semiconductor substrate is thus electrified.

To address this, the secondary electrons from the electron shower generator 11, which is disposed in the end station 12, are supplied to the ion beams. Hence, the semiconductor substrate 1 is simultaneously irradiated with both the secondary electrons and the ion beams. Doing so neutralizes the accumulated electric charges within the semiconductor substrate 1. This prevents the semiconductor substrate 1 from being electrified.

However, the passage of time deteriorates a filament that is a generation source of the secondary electrons in the electron shower generator for preventing the semiconductor substrate from being electrified. Consequently, this deterioration changes the amount of the secondary electrons supplied from the filament. It has been thus difficult to regulate the secondary electrons to be supplied.

It has been difficult to regulate the secondary electrons to be supplied from the electron shower generator in accordance with implantation energies of the ion beams or with the capacitance of electric charges in the semiconductor substrate as set. In particular, a relatively-large beam current ranging from several tens of milliamperes to several hundreds of milliamperes can polarize the ion beams due to the electric charges of themselves. This results in a non-uniform amount of ions to be implanted. Consequently, it has been difficult to regulate the secondary electrons to be supplied from the electron shower generator.

Figure 7:
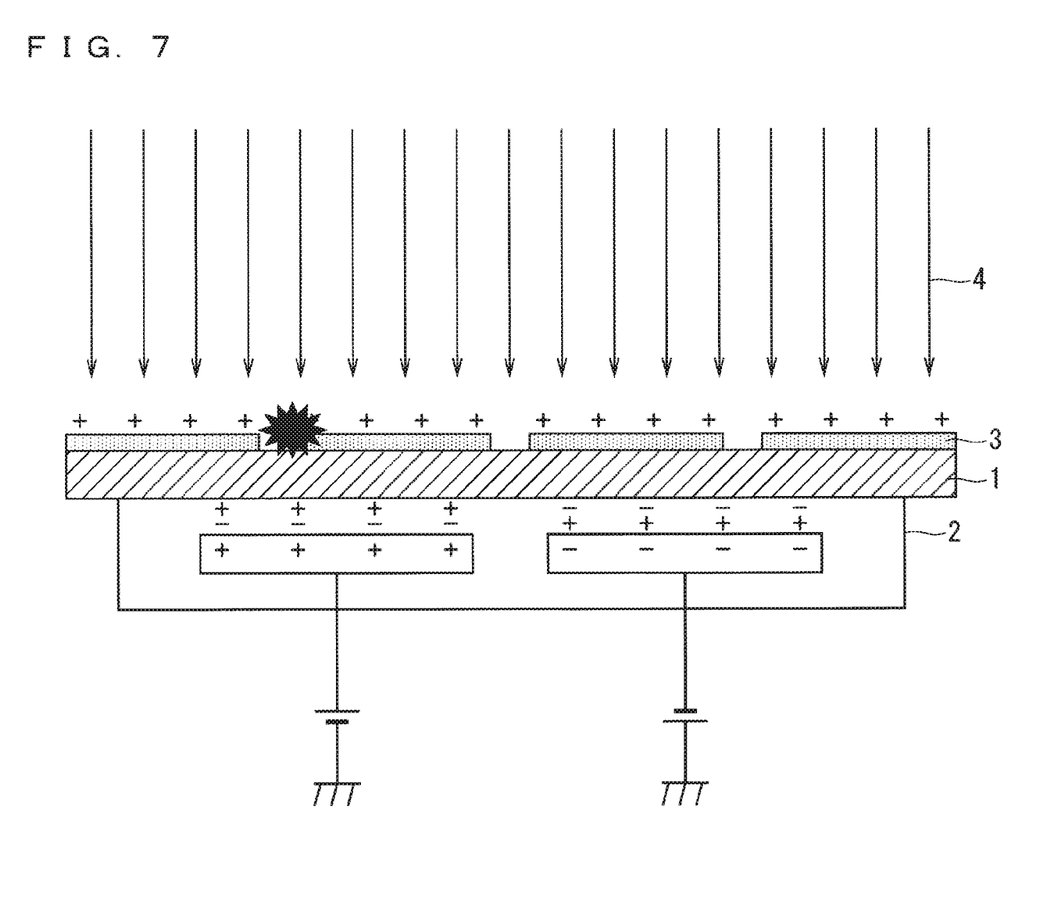
FIG. 7 is a diagram illustrating a semiconductor substrate whose front surface has an abnormal electric discharge according to the preferred embodiment.

FIG. 7 is a diagram illustrating the semiconductor substrate 1 whose front surface has an abnormal electric discharge. Components such as semiconductor elements 3 on the front surface of the semiconductor substrate 1 may be irradiated with ion beams 4 with the semiconductor substrate 1 being disposed on an electrostatic chuck stage 2, as illustrated in FIG. 7. In such a case, a relatively-large beam current ranging from several tens of milliamperes to several hundreds of milliamperes, for instance can cause electric charges in the semiconductor substrate to be saturated. Furthermore, the relatively-large beam current can create the abnormal electric discharge in the front surface of the semiconductor substrate 1. In this case, the semiconductor elements or the semiconductor substrate 1 itself might have been damaged.

On the other hand, a small beam current to prevent the semiconductor substrate from being electrified takes a long time for irradiation due to a decrease in implantation energy. Because of this long time irradiation, the ion implanter has a lower processing capability. Further, if the semiconductor substrate 1 is extremely thin in a relatively-small beam current ranging from several milliamperes to several tens of milliamperes, the abnormal electric discharge might also have damaged the semiconductor elements 3 or the semiconductor substrate 1 itself like in the relatively-large beam current.

<Configuration of the Ion Implanter>

Figure 1:
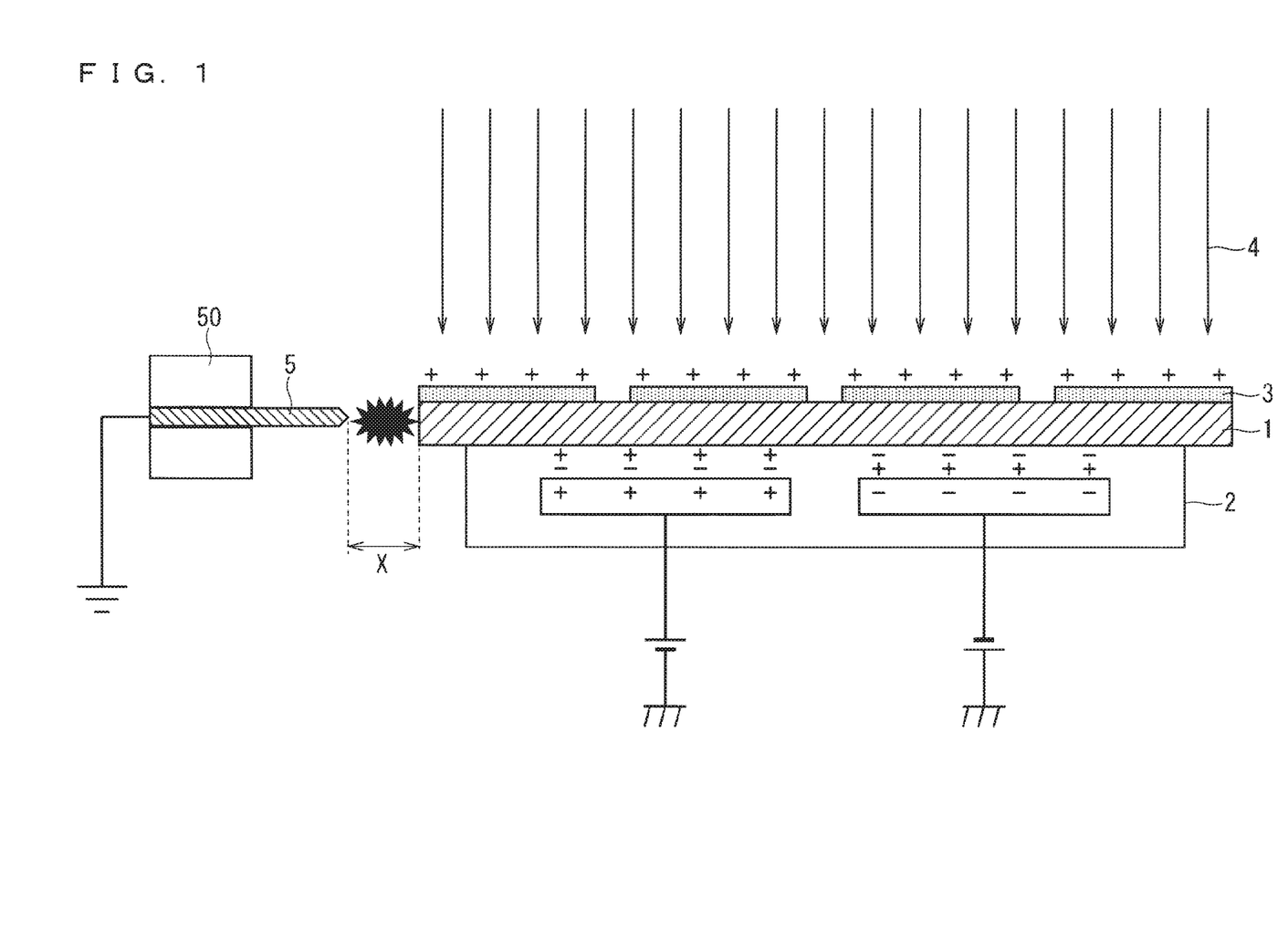
FIG. 1 is a cross-sectional view schematically illustrating a partial configuration for implementing an ion implanter according to a preferred embodiment.

FIG. 1 a cross-sectional view schematically illustrating a partial configuration for implementing the ion implanter according to a first preferred embodiment.

As illustrated in FIG. 1, upon being irradiated with ion beams 4 of a positive ion species, the front surface of the semiconductor substrate 1 on the electrostatic chuck stage 2 and front surfaces of the semiconductor elements 3 are electrified to have positive charges.

Here, a needle electrode 5 is disposed in the vicinity of a side surface of the semiconductor substrate 1. The needle electrode 5 is used to discharge charges in the semiconductor substrate 1 and semiconductor elements 3. The needle electrode 5 is an electrode for applying a ground or bias voltage. The needle electrode 5 is installed in a mechanism 50 that is movable toward thickness and side directions of the semiconductor substrate 1 so that a distance, X, between the semiconductor substrate 1 and the needle electrode 5 can be freely set. An electric discharge thus occurs between the side surface of the semiconductor substrate 1 and the end of the needle electrode 5.

<Operation of the Ion Implanter>

Figure 5:
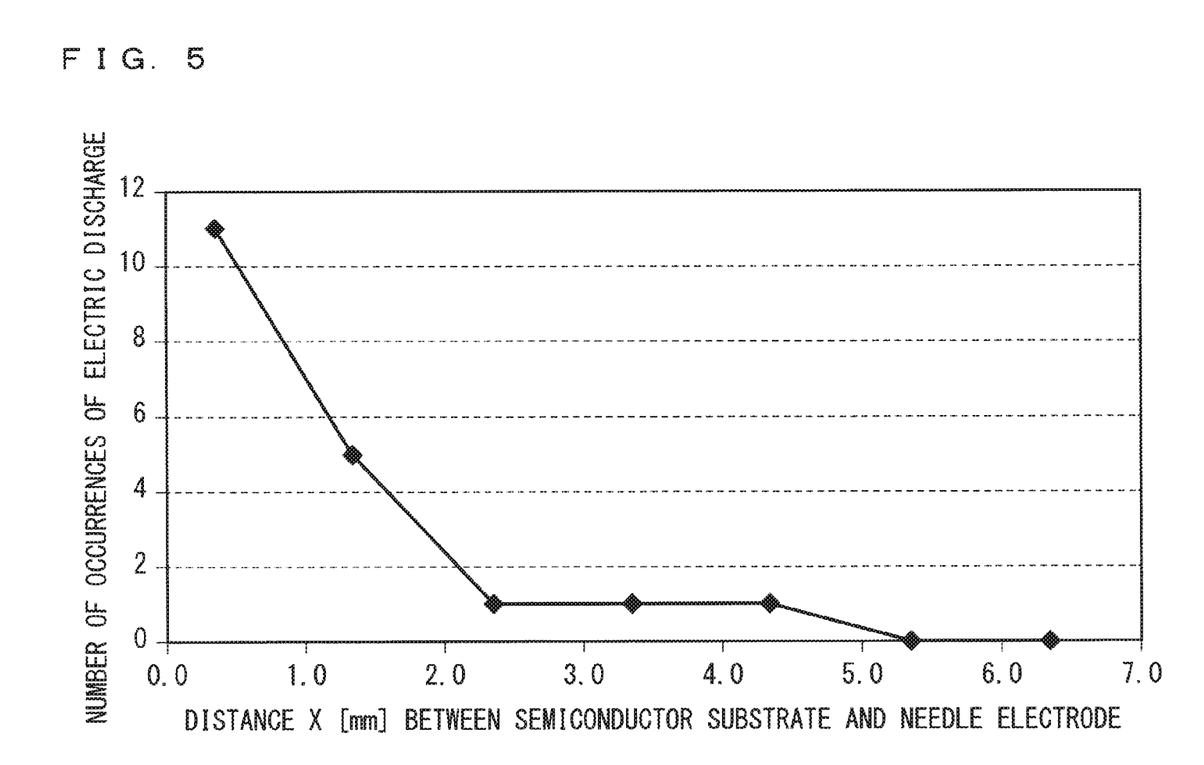
FIG. 5 is a graph illustrating a relationship between the number of occurrences of an electric discharge between a side surface of a semiconductor substrate and an end of a needle electrode, and a distance, X, between the semiconductor substrate and the needle electrode according to a preferred embodiment.

FIG. 5 is a graph illustrating a relationship between the number of occurrences of the electric discharge between the side surface of the semiconductor substrate 1 and the end of the needle electrode 5, and the distance X between the semiconductor substrate 1 and the needle electrode 5. In FIG. 5, a vertical axis denotes the number of occurrences, and a horizontal axis denotes the distance X [mm] between the semiconductor substrate 1 and the needle electrode 5.

An experiment has been conducted under a condition of beam acceleration under which the semiconductor substrate 1 is easily electrified. The condition includes implanting phosphorous (P) ions in an acceleration voltage of 50 keV and a dose of $2.0 \times 10^{12}$ atom/cm$^2$ with a standard beam current of 1.5 mA being increased to 2.0 mA.

The experiment has revealed the following results: the number of occurrences of the electric discharge is zero when the distance X from the needle electrode 5 to the side surface of the semiconductor substrate 1 is 6.4 mm, the number is zero when the distance X is 5.4 mm, the number is one when the distance X is 4.4 mm, the number is one when the distance X is 3.4 mm, the number is one when the distance X is 2.4 mm, the number is five when the distance X is 1.4 mm, and the number is 11 when the distance X is 0.4 mm.

These results have clarified that the electric discharge occurs when the distance X from the needle electrode 5 to the side surface of the semiconductor substrate 1 satisfies the following formula:

$$0 < X \leq 4.4 \text{ [mm]}. \quad \text{[Formula 1]}$$

In this case, the semiconductor elements 3 are not damaged. The standard beam current of 1.5 mA has shown a similar tendency.

In contrast, the semiconductor substrate 1 and the needle electrode 5 are always short-circuited when the semiconductor substrate 1 and the needle electrode 5 are in contact with each other; that is, when the distance X from the needle electrode 5 to the side surface of the semiconductor substrate 1 is zero. Hence, the electric charges on the electrostatic chuck stage are short-circuited. This results in unstable retaining of the electric charges on the front surface of the semiconductor substrate 1. Accordingly, the semiconductor substrate 1 and the needle electrode 5 need to be spaced apart from each other; that is, the distance X from the needle electrode 5 to the side surface of the semiconductor substrate 1 satisfies the following formula:

$$X > 0. \quad \text{[Formula 2]}$$

Meanwhile, a beam current of less than 0.75 mA as a condition of beam mitigation under which the semiconductor substrate 1 is hard to be electrified has neither created the electric discharge nor damaged the semiconductor elements 3. However, a nearly-16-minute irradiation is required for one sheet in order to irradiate with the same amount of to-be-injected energies in the beam current of less than 0.75 mA, whereas a nearly-six-minute irradiation is required for one sheet in a beam current of 2.0 mA. As a result, the ion implanter has a considerably low processing capability.

As described above, the ion implanter according to the present preferred embodiment would eliminate a need to decrease a beam current if high energy is to be injected into the apparatus in order to reduce or eliminate the semiconductor substrate 1 to be electrified. The use of the ion implanter thus enables a short-time irradiation. As a result, the ion implanter has a high processing capability.

Second Preferred Embodiment

The following describes an ion implanter according to a second preferred embodiment. Any components similar to those described in the previous preferred embodiment are denoted by the same symbols, and detailed descriptions of the like components are omitted as necessary.

<Configuration of the Ion Implanter>

Figure 2:
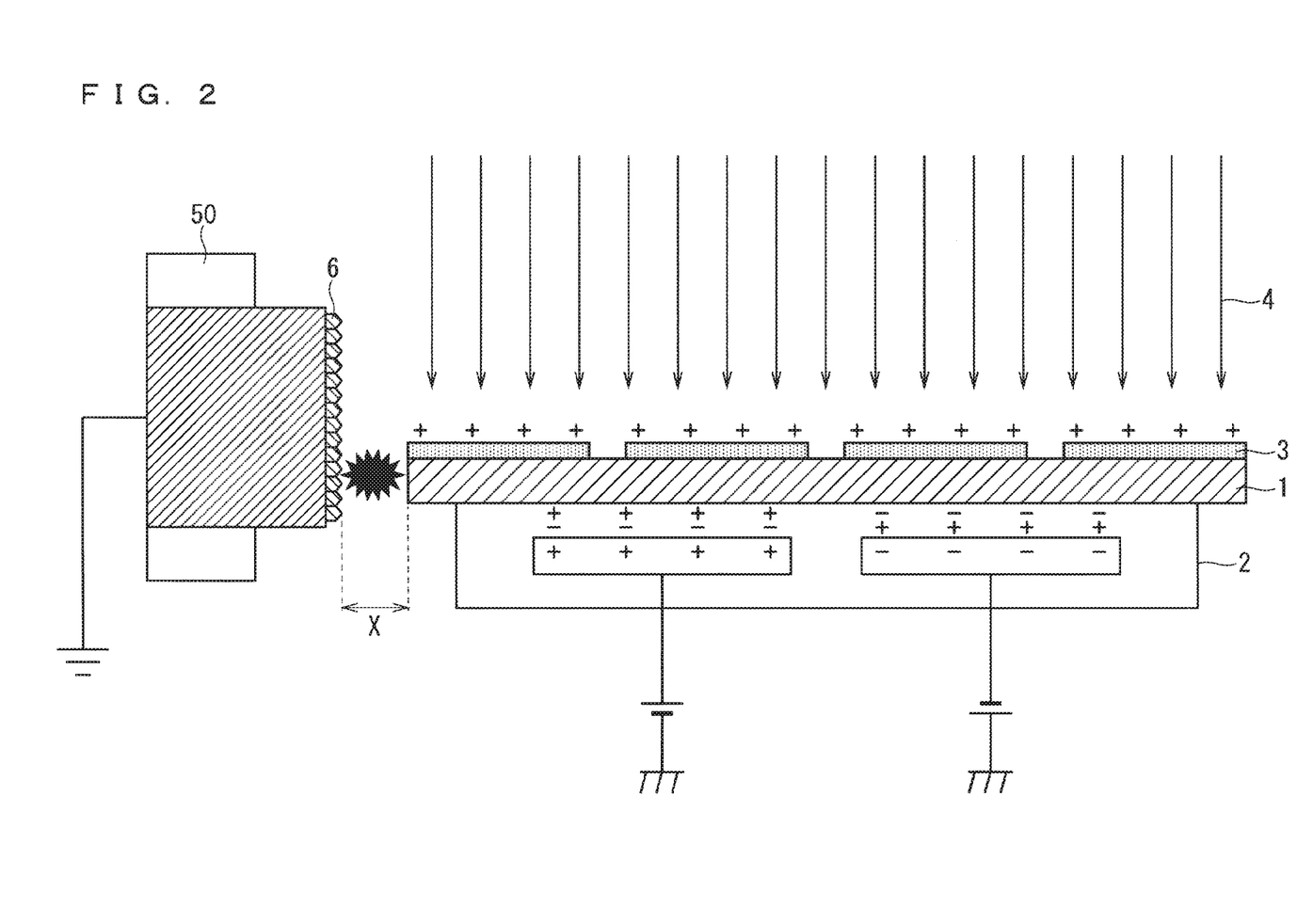
FIG. 2 is a cross-sectional view schematically illustrating a partial configuration for implementing an ion implanter according to a preferred embodiment.

FIG. 2 is a cross-sectional view schematically illustrating a partial configuration for implementing the ion implanter according to the present preferred embodiment.

As illustrated in FIG. 2, at least two or more needle electrodes 6 are arranged near a side surface of a semiconductor substrate 1, in a direction along ion beams 4, i.e., in a thickness direction of the semiconductor substrate 1. The needle electrodes 6 are attached to a mechanism 50 so as to freely set a distance, X, between the semiconductor substrate 1 and the needle electrodes 6. The mechanism 50 is movable in the thickness direction of the semiconductor substrate 1 and movable to a side of the semiconductor substrate 1. Such a configuration eliminates a need for positioning of the direction of the needle electrodes 6 along the ion beams 4, i.e., positioning of the thickness direction of the semiconductor substrate 1. As a result, an electric discharge would certainly occur if, for instance, the semiconductor substrate 1 is thin or has a non-uniform thickness.

Third Preferred Embodiment

The following describes an ion implanter according to a third preferred embodiment. Any components similar to those described in the previous preferred embodiments are denoted by the same symbols, and detailed descriptions of the like components are omitted as necessary.

<Configuration of the Ion Implanter>

Figure 3:
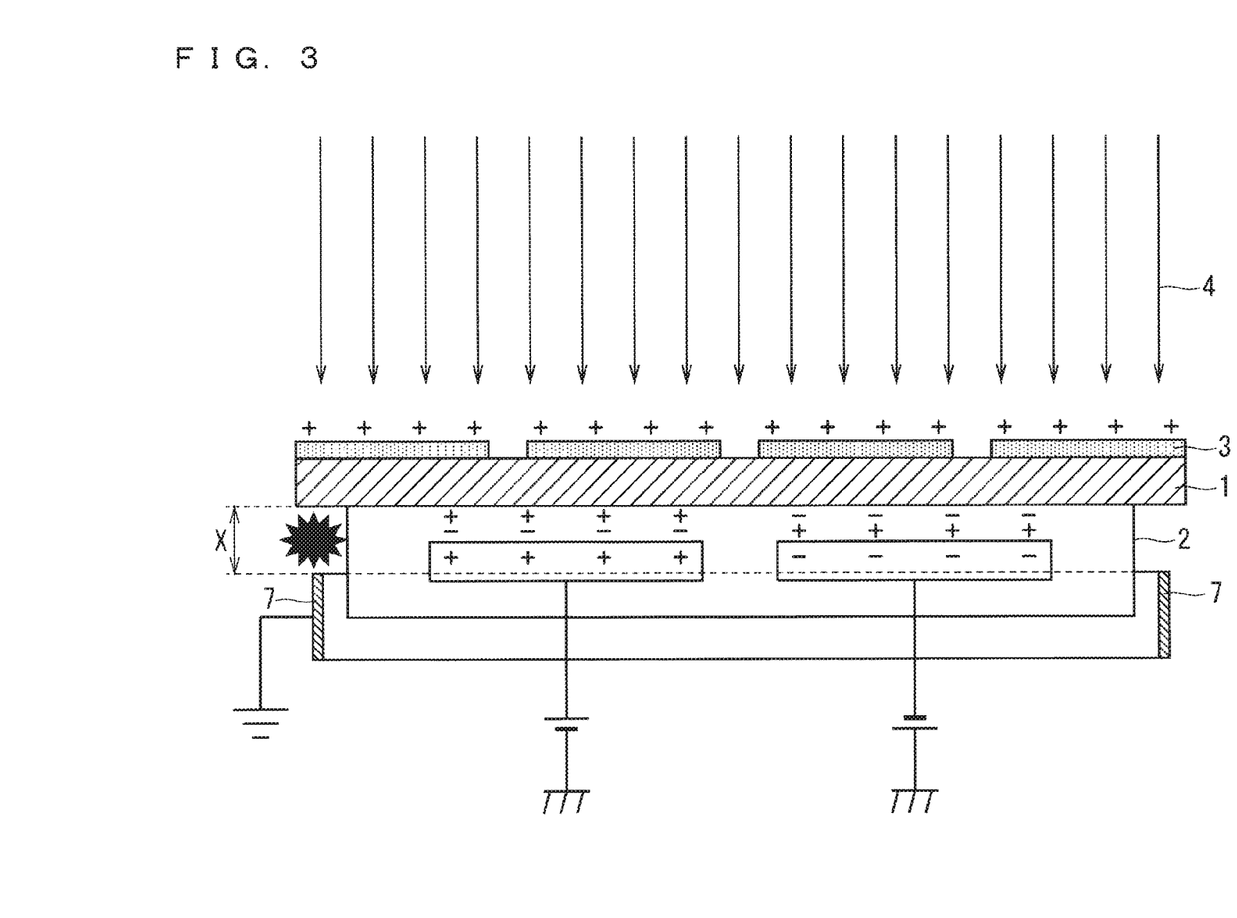
FIG. 3 is a cross-sectional view schematically illustrating a partial configuration for implementing an ion implanter according to a preferred embodiment.

FIG. 3 is a cross-sectional view schematically illustrating a partial configuration for implementing the ion implanter according to the present preferred embodiment.

As illustrated in FIG. 3, a thin annular electrode 7 is disposed near a back surface of a semiconductor substrate 1, i.e., near an opposite surface of a front surface of the semiconductor substrate 1, where the front surface is irradiated with ion beams 4. The annular electrode 7 is attached to a mechanism (not shown) that is movable in a thickness direction of the semiconductor substrate 1. The annular electrode 7 is an electrode to which a ground voltage or bias voltage is applied.

The annular electrode 7, which is annually arranged along the outer periphery of the semiconductor substrate 1, would create an electric discharge in the entire outer periphery of the semiconductor substrate 1 if electric charges unevenly spread across a surface of the semiconductor substrate 1. Moreover, the annular electrode 7 causes the electric discharge to occur in the back surface of the semiconductor substrate 1. Consequently, the electric discharge would occur by merely adjusting the thickness direction of the semiconductor substrate 1 if the semiconductor substrate 1 has an uneven thickness. This achieves a simple ion implanter in configuration. Moreover, this facilitates regulation of a distance, X, between the semiconductor substrate 1 and the annular electrode 7.

The needle electrode in the first preferred embodiment or the needle electrodes of the second preferred embodiment may be formed around the semiconductor substrate 1 in a plan view, i.e., annularly formed in a plan view.

Further, the annular electrode 7 may be formed around the semiconductor substrate 1 so as to be partially missing in a plan view; that is, the annular electrode 7 may be discontinuously formed around the semiconductor substrate 1 in a plan view.

Fourth Preferred Embodiment

The following describes an ion implanter according to a fourth preferred embodiment. Any components similar to those described in the previous preferred embodiments are denoted by the same symbols, and detailed descriptions of the like components are omitted as necessary.

<Configuration of the Ion Implanter>

Figure 4:
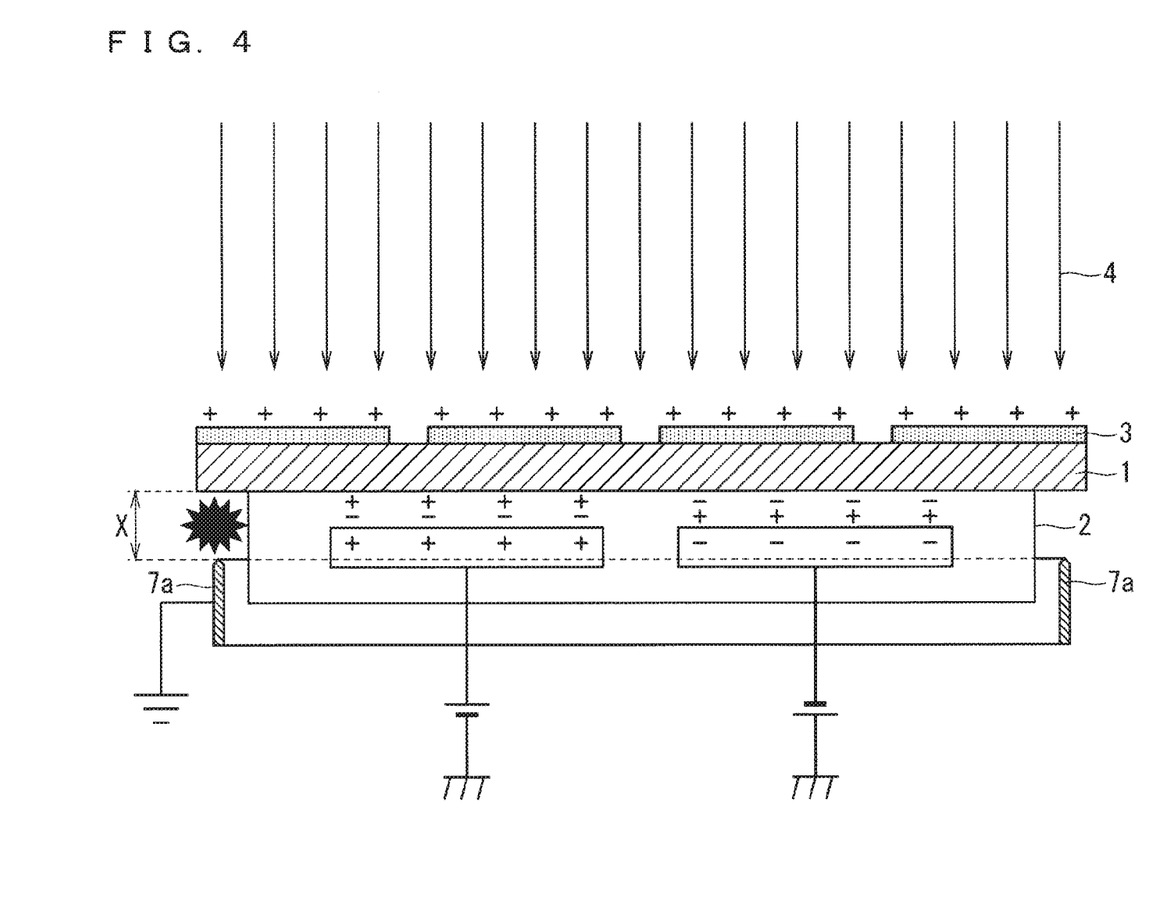
FIG. 4 is a cross-sectional view schematically illustrating a partial configuration for implementing an ion implanter according to a preferred embodiment.

FIG. 4 is a cross-sectional view schematically illustrating a partial configuration for implementing the ion implanter according to the present preferred embodiment.

As illustrated in FIG. 4, a thin annular electrode 7a is disposed near a back surface of a semiconductor substrate 1, i.e., near an opposite surface of a front surface of the semiconductor substrate 1, where the front surface is irradiated with ion beams 4. The annular electrode 7a is attached to a mechanism (not shown) that is movable in a thickness direction of the semiconductor substrate 1. The annular electrode 7a is formed to have a pointed end like a needle.

Having such a pointed end, the annular electrode 7 has concentrated electric charges as discharged. Consequently, this enables the electric discharge to occur with more certainty.

It is noted that like the needle electrodes in the second preferred embodiment, a plurality of annular electrodes 7a may be disposed in a direction crossing a direction from the annular electrode 7a toward the semiconductor substrate 1, i.e., in a direction along the back surface of the semiconductor substrate 1.

It is further noted that the annular electrode 7a may be formed around the semiconductor substrate 1 so as to be partially missing in a plan view; that is, the annular electrode 7a may be discontinuously formed around the semiconductor substrate 1 in a plan view.

Effects of the Preferred Embodiments

The following illustrates effects of the above-described preferred embodiments. These effects are based on specific configurations that are illustrated in the above-described preferred embodiments. Moreover, to an extent that like effects are obtained, these specific configurations may be replaced with different specific embodiments that are illustrated in the specification. Further, the replacement may be done over several preferred embodiments. That is, combinations of the individual configurations, which are illustrated in the different preferred embodiments, may bring like effects.

According to the above-described preferred embodiments, the ion implanter includes the ion irradiation unit and at least one electrode. Here, the ion source system 8 corresponds to the ion irradiation unit. Moreover, at least one of the needle electrode 5, needle electrodes 6, annular electrode 7 and annular electrode 7a corresponds to the at least one electrode. The ion source system 8 irradiates the front surface of the semiconductor substrate 1 with ions. The needle electrode 5 is disposed in a position in the vicinity of at least one of a back surface or side surface of an end of said semiconductor substrate. The position is dischargeable to and from the semiconductor substrate 1. The needle electrode 5 is spaced apart from the semiconductor substrate 1.

According to such a configuration, the needle electrode 5 causes the electric discharge to occur near the end of the semiconductor substrate 1. This reduces or eliminates the damage to the semiconductor substrate 1 due to the abnormal electric discharge through a simple method. Moreover, the semiconductor substrate 1 is not in contact with the needle electrode 5. This reduces or eliminates a polluted semiconductor substrate 1 caused by the needle electrode 5, or the damage to the semiconductor substrate 1 caused by the needle electrode 5.

Different configurations illustrated in the specification other than the above configurations may be omitted as necessary. That is, the above configurations alone bring the above-described effect. However, the above configurations may additionally include at least one of the different configurations illustrated in the specification as necessary. That is, the above configurations may additionally include the different configurations illustrated in the specification, which are excluded from these configurations. Such an additionally-included configuration still brings the above-described effect similarly.

According to the above-described preferred embodiment, a distance between the needle electrode and the semiconductor substrate 1 is 4.4 mm or more. Such a configuration enables the electric discharge to occur appropriately under the condition of beam acceleration under which the semiconductor substrate 1 is easy to be electrified.

Further, according to the above-described preferred embodiment, a plurality of needle electrodes 6 are arranged in the direction crossing the direction from the needle electrodes 6 toward the semiconductor substrate 1. Such a configuration eliminates the need for the positioning of the needle electrodes 6 in the direction crossing the direction from the needle electrodes 6 toward the semiconductor substrate 1. Hence, arranging the needle electrodes 6 in a direction along the ion beams 4, i.e., in the thickness direction of the semiconductor substrate 1, for instance, eliminates the need for the positioning the needle electrodes 6. Consequently, this would enable the electric discharge to occur with certainty if the semiconductor substrate 1 is thin or has the non-uniform thickness. Moreover, arranging multiple annular electrodes 7a in a direction along the back surface of the semiconductor substrate 1 eliminates a need for positioning the annular electrodes 7a in a radial direction of the semiconductor substrate 1.

Still further, according to the above-described preferred embodiment, the annular electrode 7 is disposed around at least part of the semiconductor substrate 1 in a plan view. According to such a configuration, the use of the annular electrode 7 would cause the electric discharge to occur in almost the entire side surface of the semiconductor substrate 1 if the electric charges resulting from the ion implantation unevenly spread across the surface of the semiconductor substrate 1. Moreover, the electric discharge occurs in the back surface of the semiconductor substrate 1. Consequently, the electric discharge would occur by merely adjusting the thickness direction of the semiconductor substrate 1 if the semiconductor substrate 1 has an uneven thickness. This achieves a simple ion implanter in configuration. Moreover, this facilitates the regulation of the distance X between the semiconductor substrate 1 and the annular electrode 7.

Yet further, according to the above-described preferred embodiment, the annular electrode 7a has the pointed end toward the semiconductor substrate 1. In such a configuration, having such a pointed end, the annular electrode 7a has the concentrated electric charges as discharged. Consequently, this enables the electric discharge to occur with more certainty.

Variations of the Preferred Embodiments

The material quality, material, size, or shape of each component, the positions of components relative to each other, or a condition for implementation described in each of the preferred embodiments is in all aspects illustrative and does not limit the present invention. Thus, numerous variations not shown can be assumed within the range of the technique disclosed in the specification. Examples of the variations include modification, addition and omission of at least one component. Further example includes extraction of at least one component from at least one of the preferred embodiments and combination of the extracted component with another component of a different preferred embodiment.

Further, unless otherwise contradicted, "one" component described in each of the preferred embodiments may include "one or more" components. Additionally, individual components are conceptual units. One component may include multiple structures, one component may correspond to a part of some structure, and multiple components may be included in one structure. Each component includes a structure of a different configuration or a different shape as long as the structure of the different configuration or the different shape achieves the same function.

Still further, the descriptions in the specification are referred for any purposes of the present technique. It is thus not an admission that any of the descriptions provided herein are conventional techniques.

Yet further, if the above-described preferred embodiments contain descriptions about materials without being particularly specified, it is to be understood that an example of these materials includes alloys containing other additives in these materials unless otherwise contradicted.

While the invention has been shown and described in detail, the foregoing description is in all aspects illustrative and not restrictive. It is therefore understood that numerous modifications and variations can be devised without departing from the scope of the invention.

What is claimed is:

1. An ion implanter comprising:
   an ion irradiation unit configured to irradiate a front surface of a semiconductor substrate with an ion; and
   at least one electrode disposed in a position in a vicinity of at least one of back and side surfaces of an end of said semiconductor substrate, said position being electrically dischargeable to and from said semiconductor substrate, said at least one electrode being spaced apart from said semiconductor substrate, and an end of said at least one electrode comprising a point and a surface extending in a direction away from the semiconductor substrate on opposite sides of the point.

2. The ion implanter according to claim 1, wherein a distance between the point of said at least one electrode and said semiconductor substrate is 4.4 mm or less.

3. The ion implanter according to claim 1, wherein said at least one electrode comprises a plurality of electrodes arranged in a first direction crossing a second direction that extends from said at least one electrode toward said semiconductor substrate.

4. The ion implanter according to claim 1, wherein said at least one electrode is disposed around at least a part of said semiconductor substrate in a plan view.

5. The ion implanter according to claim 1, wherein said at least one electrode has a pointed end toward said semiconductor substrate.

* * * * *